(12) United States Patent
Yin et al.

(10) Patent No.: US 10,930,686 B2
(45) Date of Patent: Feb. 23, 2021

(54) IMAGE SENSING SYSTEM AND MULTI-FUNCTION IMAGE SENSOR THEREOF

(71) Applicant: Guangzhou Tyrafos Semiconductor Technologies Co., LTD, Guangzhou (CN)

(72) Inventors: Ping-Hung Yin, Taipei (TW); Jia-Shyang Wang, Miaoli County (TW)

(73) Assignee: Guangzhou Tyrafos Semiconductor Technologies Co., LTD, Guangzhou (CN)

( * ) Notice: Subject to any disclaimer, the term of this patent is extended or adjusted under 35 U.S.C. 154(b) by 0 days.

(21) Appl. No.: 16/424,491

(22) Filed: May 29, 2019

(65) Prior Publication Data

US 2019/0371842 A1 Dec. 5, 2019

Related U.S. Application Data

(60) Provisional application No. 62/677,626, filed on May 29, 2018.

(51) Int. Cl.
*H01L 27/14* (2006.01)
*H01L 27/146* (2006.01)
(Continued)

(52) U.S. Cl.
CPC ..... *H01L 27/14605* (2013.01); *H04N 5/2354* (2013.01); *H04N 5/341* (2013.01); *H04N 5/378* (2013.01)

(58) Field of Classification Search
CPC ............ H01L 27/14605; H04N 5/2354; H04N 5/378; H04N 5/341; H04N 5/353;
(Continued)

(56) References Cited

U.S. PATENT DOCUMENTS

2014/0211193 A1  7/2014 Bloom et al.
2017/0230638 A1* 8/2017 Wajs .................... H04N 13/214

FOREIGN PATENT DOCUMENTS

CN  104519338  4/2015
TW  201715881  5/2017

OTHER PUBLICATIONS

"Office Action of Taiwan Counterpart Application," dated Dec. 6, 2019, p. 1-p. 7.

* cited by examiner

*Primary Examiner* — Tony Ko
(74) *Attorney, Agent, or Firm* — JCIPRNET

(57) ABSTRACT

An image sensing system and a multi-function image sensor thereof are provided. The multi-function image sensor includes a pixel array circuit and a readout circuit. The pixel array circuit includes a plurality of pixel units. Each of the pixel units is controlled by a first control signal group in a first mode to perform a time-of-flight sensing operation and sequentially generates a plurality of first output voltages. Each of the pixel units is controlled by a second control signal group in a second mode to perform a structured light sensing operation and sequentially generates a plurality of second output voltages. The readout circuit respectively obtains a plurality of first digital information corresponding to the time-of-flight sensing operation according to the first output voltages in the first mode. The readout circuit respectively obtains a plurality of second digital information corresponding to the structured light sensing operation according to the second output voltages in the second mode.

11 Claims, 10 Drawing Sheets

(51) Int. Cl.
  *H04N 5/235* (2006.01)
  *H04N 5/378* (2011.01)
  *H04N 5/341* (2011.01)
(58) Field of Classification Search
  CPC .. H04N 5/37452; H04N 5/2253; H04N 5/335;
  G01D 5/26
  See application file for complete search history.

IMAGE SENSING SYSTEM AND MULTI-FUNCTION IMAGE SENSOR THEREOF

CROSS-REFERENCE TO RELATED APPLICATION

This application claims the priority benefit of U.S. provisional application Ser. No. 62/677,626, filed on May 29, 2018. The entirety of the above-mentioned patent application is hereby incorporated by reference herein and made a part of this specification.

BACKGROUND OF THE INVENTION

1. Field of the Invention

The invention relates to a sensing technology, and more particularly, to an image sensing system and a multi-function image sensor thereof.

2. Description of Related Art

With the advancement of technology, three-dimensional (3D) sensing technologies have been applied in many electronic products. At present, the common 3D sensing technologies include a stereo vision sensing technology, a structured light sensing technology, and a time-of-flight (TOF) sensing technology, but not limited thereto.

In general, different 3D sensing technologies will adopt different image sensors. For instance, the structured light sensing technology is used to emit a light pattern of a specific pattern on an object, and obtain a deformation of the light pattern by sensing a light coding on a surface of the object through an image sensor, so as to detect a 3D depth of the object. The time-of-flight sensing technology is used to emit an infrared light on an object, receive a reflected light on a surface of the object, and calculate a 3D depth of the object by measuring a time difference. Due to the technical difference between the structured light sensing technology and the time-of-flight sensing technology, the current image sensor applied to the structured light sensing technology cannot be applied to the time-of-flight sensing technology, and vice versa. In other words, since the current image sensors cannot be used in different 3D sensing technology fields, their application ranges are quite limited.

SUMMARY OF THE INVENTION

Accordingly, the invention provides an image sensing system and a multi-function image sensor thereof, which include both a structured light sensing function and a time-of-flight sensing function.

The image sensing system of the invention includes a light emitting module and a multi-function image sensor. The light emitting module is configured to transmit a light wave into a space. The multi-function image sensor is configured to sense a reflected light of the light wave reflected in the space. The multi-function image sensor includes a pixel array circuit and a readout circuit. The pixel array circuit includes a plurality of pixel units. Each of the pixel units is controlled by a first control signal group in a first mode to perform a time-of-flight sensing operation on the reflected light and sequentially generates a plurality of first output voltages. Each of the pixel units is controlled by a second control signal group in a second mode to perform a structured light sensing operation on the reflected light and sequentially generates a plurality of second output voltages. The readout circuit is coupled to the pixel array circuit, configured to respectively obtain a plurality of first digital information corresponding to the time-of-flight sensing operation according to the first output voltages generated by each of the pixel units in the first mode, and configured to respectively obtain a plurality of second digital information corresponding to the structured light sensing operation according to the second output voltages generated by each of the pixel units in the second mode.

The multi-function image sensor of the invention is configured to sense a reflected light of the light wave reflected in the space. The multi-function image sensor includes a pixel array circuit and a readout circuit. The pixel array circuit includes a plurality of pixel units. Each of the pixel units is controlled by a first control signal group in a first mode to perform a time-of-flight sensing operation on the reflected light and sequentially generates a plurality of first output voltages. Each of the pixel units is controlled by a second control signal group in a second mode to perform a structured light sensing operation on the reflected light and sequentially generates a plurality of second output voltages. The readout circuit is coupled to the pixel array circuit, configured to respectively obtain a plurality of first digital information corresponding to the time-of-flight sensing operation according to the first output voltages generated by each of the pixel units in the first mode, and configured to respectively obtain a plurality of second digital information corresponding to the structured light sensing operation according to the second output voltages generated by each of the pixel units in the second mode.

Based on the above, in the image sensing system and the multi-function image sensor thereof as proposed by the invention, the pixel array circuit can perform the time-of-flight sensing operation or the structured light sensing operation according to the different control signal groups (i.e., the first control signal group and the second control signal group). Therefore, other than being applicable in the time-of-flight sensing system or the structured light sensing system, the multi-function image sensor may also be dynamically switched between the time-of-flight sensing operation and the structured light sensing operation based on actual applications to significantly improve application range and flexibility for the image sensing system and the multi-function image sensor.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
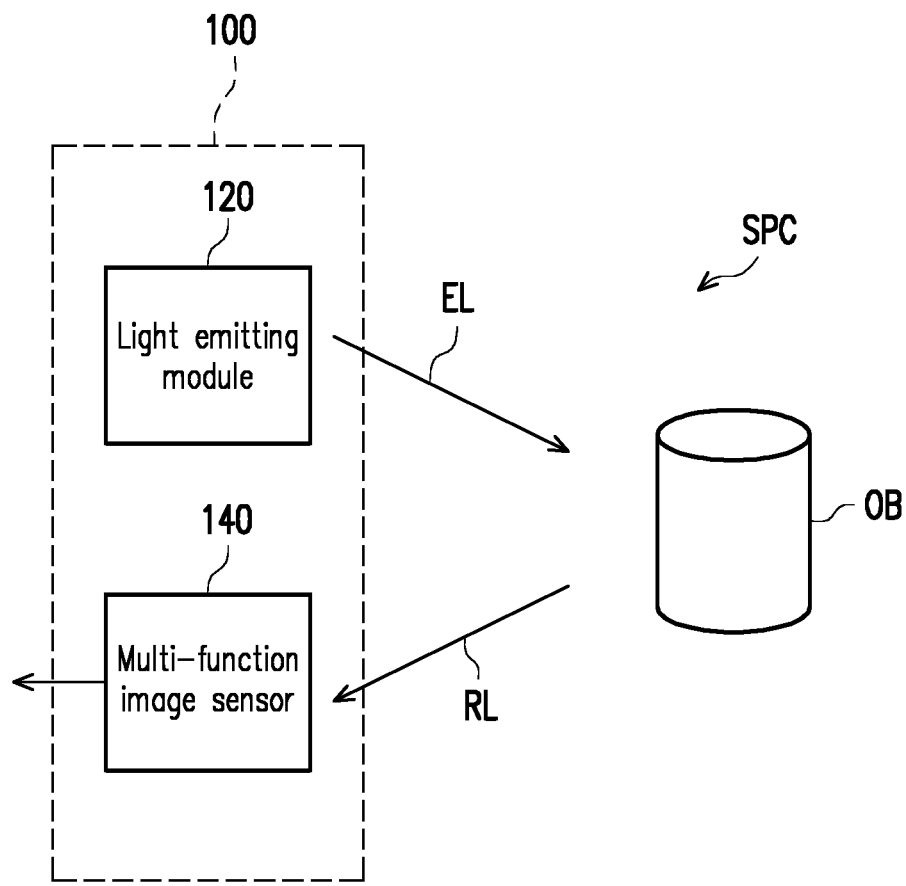
FIG. 1 is a diagram illustrating an application scenario of the image sensing system according to an embodiment of the invention.

Reference will now be made in detail to the present preferred embodiments of the disclosure, examples of which are illustrated in the accompanying drawings. Wherever possible, the same reference numbers are used in the drawings and the description to refer to the same or like parts.

Descriptions of the invention are given with reference to the exemplary embodiments illustrated with accompanied drawings, in which same or similar parts are denoted with same reference numerals. In addition, whenever possible, identical or similar reference numbers stand for identical or similar elements in the figures and the embodiments.

Figure 2:
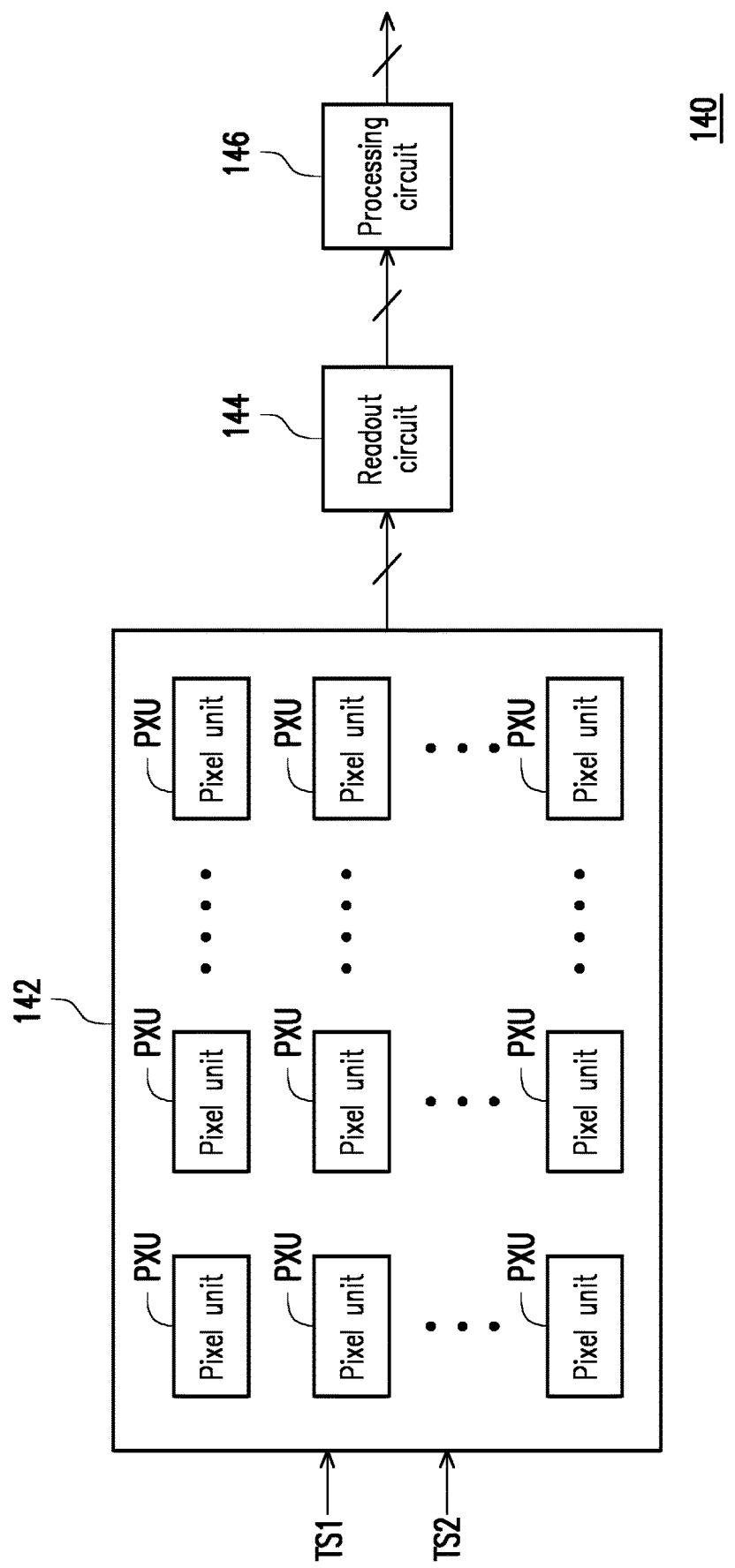
FIG. 2 is a circuit block diagram illustrating the multi-function image sensor according to an embodiment of the invention.

FIG. 1 is a diagram illustrating an application scenario of the image sensing system according to an embodiment of the invention, and FIG. 2 is a circuit block diagram illustrating the multi-function image sensor according to an embodiment of the invention. Referring to FIG. 1 and FIG. 2 together, an image sensing system 100 can include a light emitting module 120 and a multi-function image sensor 140, but not limited thereto. The light emitting module 120 is configured to transmit a light wave EL into a space SPC. The light wave EL is reflected after encountering an object OB in the space SPC. The multi-function image sensor 140 is configured to sense a reflected light RL of the light wave EL reflected in the space SPC.

In an embodiment of the invention, the light emitting module 120 may be implemented by adopting a laser diode module, a light-emitting diode module or other light emitting elements, but the invention is not limited thereto.

As shown by FIG. 2, the multi-function image sensor 140 can include a pixel array circuit 142 and a readout circuit 144, but the invention is not limited thereto. The pixel array circuit 142 can include a plurality of pixel units PXU arranged in an array. Each of the pixel units PXU can be controlled by a first control signal group TS1 in a first mode to perform a time-of-flight sensing operation on the reflected light RL and sequentially generate a plurality of first output voltages. In addition, each of the pixel units PXU can be controlled by a second control signal group TS2 in a second mode to perform a structured light sensing operation on the reflected light RL and sequentially generate a plurality of second output voltages.

The readout circuit 144 is coupled to the pixel array circuit 142. The readout circuit 144 can respectively obtain a plurality of first digital information corresponding to the time-of-flight sensing operation according to the first output voltages generated by each of the pixel units PXU in the first mode. In addition, the readout circuit 144 can respectively obtain a plurality of second digital information corresponding to the structured light sensing operation according to the second output voltages generated by each of the pixel units PXU in the second mode.

In an embodiment of the invention, the multi-function image sensor 140 may also optionally include a processing circuit 146. The processing circuit 146 is coupled to the readout circuit 144. The processing circuit 146 can perform an operation on the plurality of first digital information of each of the pixel units PXU in the first mode to obtain a digital pixel value corresponding to each of the pixel units PXU. In addition, the processing circuit 146 can perform an operation on the plurality of second digital information of each of the pixel units PXU in the second mode to obtain a digital pixel value corresponding to each of the pixel units PXU. In an embodiment of the invention, the first control signal group TS1 and the second control signal group TS2 may be provided by the processing circuit 146.

In another embodiment of the invention, the processing circuit 146 shown by FIG. 2 may also be implemented by using an independent image processing device other than the multi-function image sensor 140. In this way, the multi-function image sensor 140 can omit the processing circuit 146.

It should be understood that, by providing the different control signal groups (i.e., the first control signal group TS1 and the second control signal group TS2) to the same pixel array circuit 142, the pixel array circuit 142 can perform the time-of-flight sensing operation or the structured light sensing operation. Therefore, other than being applicable in both a time-of-flight sensing system or a structured light sensing system, the multi-function image sensor 140 proposed by the embodiments of the invention may also be dynamically switched between the time-of-flight sensing operation and the structured light sensing operation based on actual applications to significantly improve application range and flexibility for the multi-function image sensor 140.

In an embodiment of the invention, the readout circuit 144 may be implemented by adopting existing readout circuits. For instance, the readout circuit 144 may be implemented by adopting readout circuits having a correlated double sampling circuit (CDS) circuit and an analog-to-digital converter (ADC). However, the invention is not limited in this regard. The circuit structure of the readout circuit 144 is not particularly limited by the invention. Implementation and operation of the readout circuit are well-known to persons of ordinary skill in the art, and are thus not repeated hereinafter.

In an embodiment of the invention, the processing circuit 146 may be hardware, firmware, software or machine executable program codes stored in a memory to be loaded and executed by a micro-controller or a micro-processor. In form of hardware, the processing circuit 146 may be implemented by one single integrated circuit chip, or may be implemented by a plurality of circuit chips, but the invention is not limited thereto. The circuit chips or the integrated circuit chip may be implemented by adopting an application-specific integrated circuit (ASIC) or a field programmable gate array (FPGA) or a complex programmable logic device (CPLD). The memory may be, for example, a random access memory, a read-only memory or a flash memory.

Detailed operations of the image sensing system 100 and the multi-function image sensor 140 are described as follows. For illustrative convenience, pixel units in a 5 transistor (5T) global shutter are used below as an example, but the invention is not limited thereto. The pixel units of the invention may also be implemented by using other known pixel circuits. The circuit structure of the pixel unit is not particularly limited by the invention. Moreover, since each pixel unit has the same circuit structure and operation, only one of the pixel units is used as an example in the following description.

Figure 3:
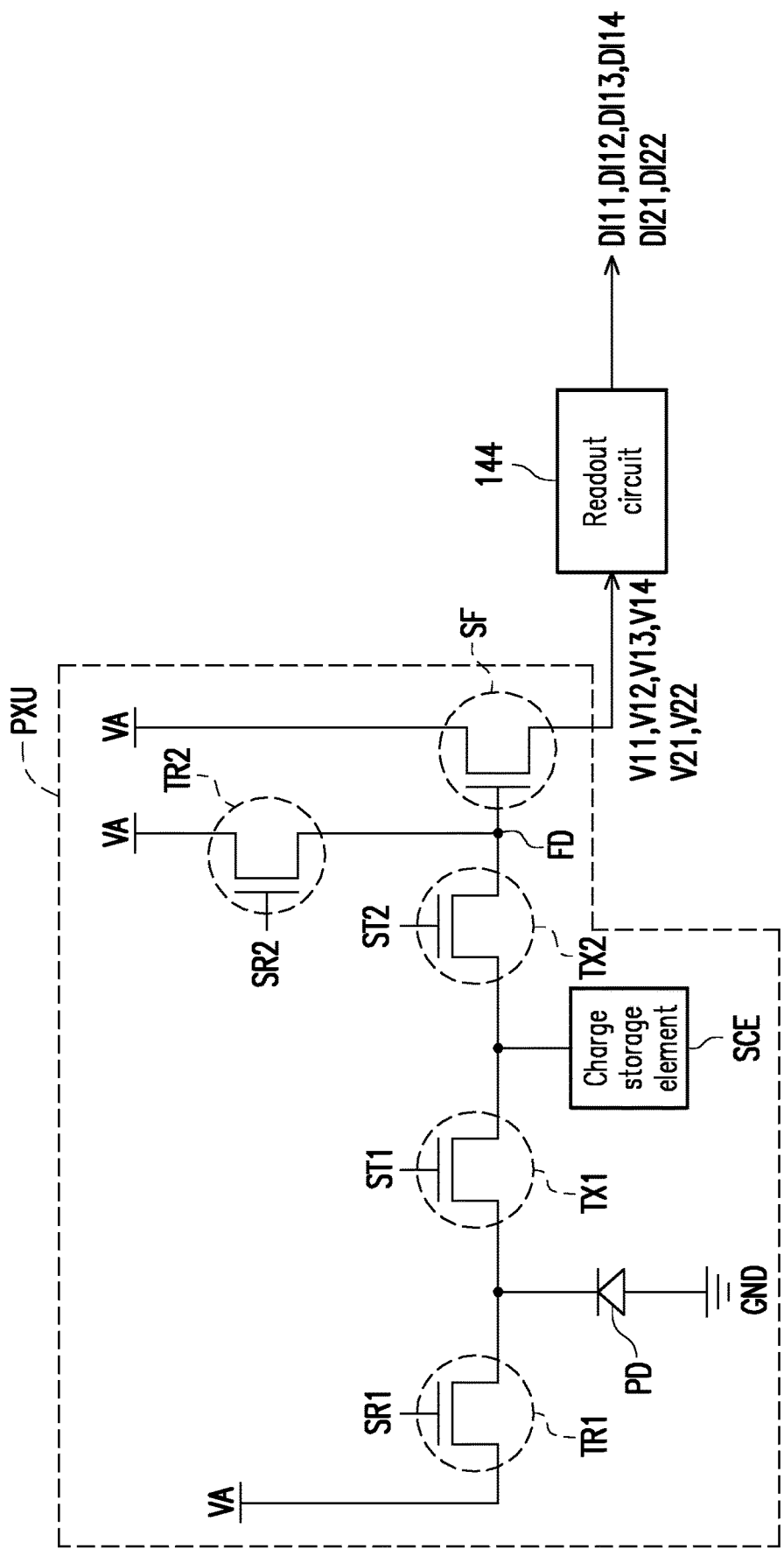
FIG. 3 is a schematic diagram of the circuit structure of the pixel unit and its coupling with the readout circuit according to an embodiment of the invention.

FIG. 3 is a schematic diagram of the circuit structure of the pixel unit and its coupling with the readout circuit according to an embodiment of the invention. The pixel unit PXU can include a photo sensor PD, a charge storage element SCE, transmission switches TX1 and TX2, reset switches TR1 and TR2 and a source follower transistor SF. A first terminal of the reset switch TR1 is coupled to a reset power VA. A control terminal of the reset switch TR1 is configured to receive a reset control signal SR1. A second terminal of the reset switch TR1 is coupled to a cathode of the photo sensor PD. An anode of the photo sensor PD is coupled to a ground voltage GND. A first terminal of the transmission switch TX1 is coupled to the cathode of the photo sensor PD. A control terminal of the transmission switch TX1 is configured to receive a transmission control signal ST1. A second terminal of the transmission switch TX1 is coupled to the charge storage element SCE. A first terminal of the transmission switch TX2 is coupled to the charge storage element SCE. A control terminal of the transmission switch TX2 is configured to receive a transmission control signal ST2. A second terminal of the transmission switch TX2 is coupled to a float diffusion node FD. A first terminal of the reset switch TR2 is coupled to the reset power VA. A control terminal of the reset switch TR2 is configured to receive a reset control signal SR2. A second terminal of the reset switch TR2 is coupled to the float diffusion node FD. A first terminal of the source follower transistor SF is coupled to the reset power VA. A control terminal of the source follower transistor SF is coupled to the float diffusion node FD. A second terminal of the source follower transistor SF is configured to output first output voltages V11 to V14 or second output voltages V21 and V22.

Figure 4A:
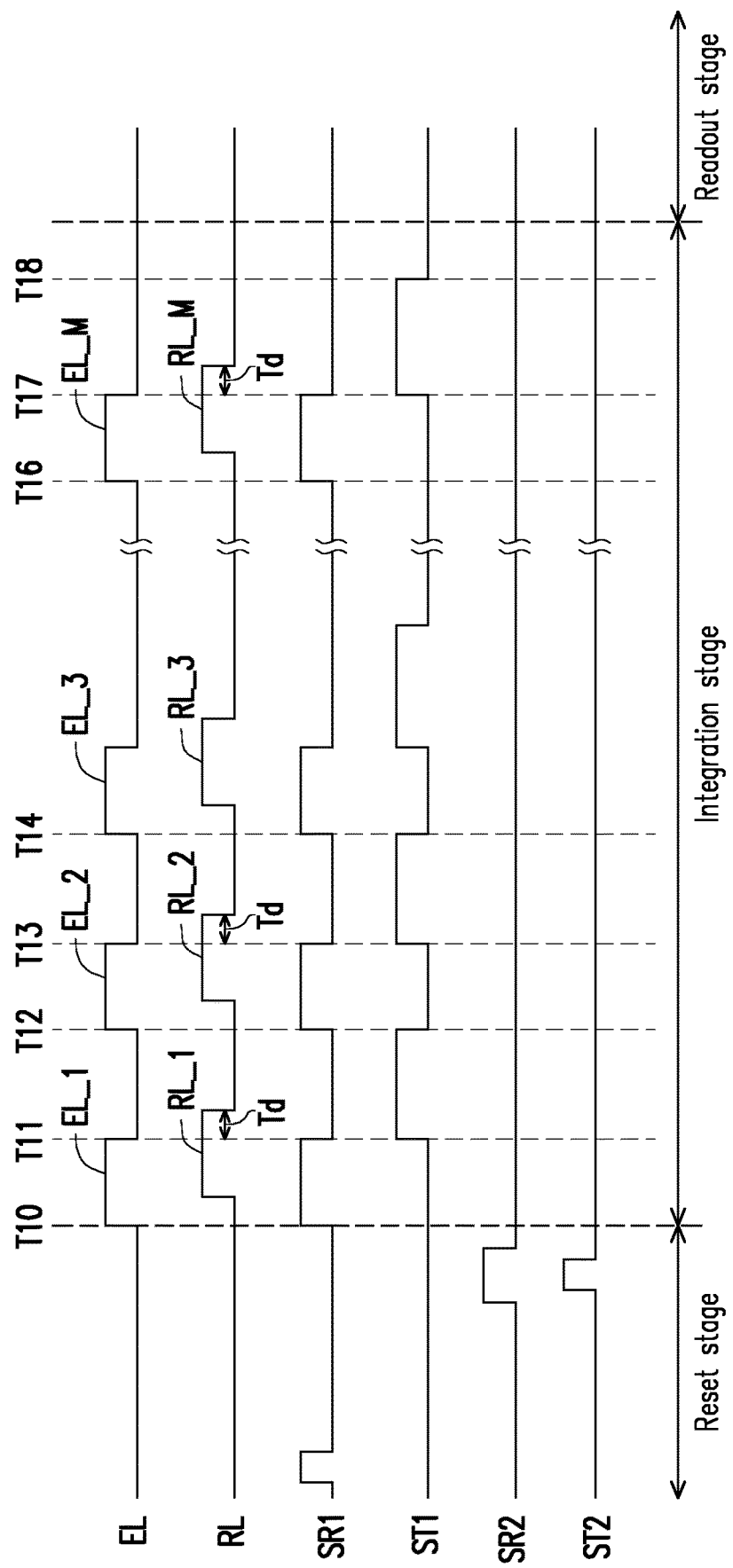
FIG. 4A to FIG. 4D illustrate timing diagrams of signals in the time-of-flight sensing operation performed by the pixel unit in the first mode according to an embodiment of the invention.

FIG. 4A to FIG. 4D illustrate timing diagrams of signals in the time-of-flight sensing operation performed by the pixel unit in the first mode according to an embodiment of the invention. Here, the reset control signals SR1 and SR2 and the transmission control signals ST1 and ST2 illustrated in FIG. 4A to FIG. 4D are the first control signal group TS1 shown by FIG. 2. The following paragraphs refer to FIG. 1, FIG. 2, FIG. 3 and FIG. 4A together. In FIG. 4A, the pixel unit PXU performs the time-of-flight sensing operation for a $(4N+1)^{th}$ frame, wherein N is an integer greater than or equal to zero. First of all, in a reset stage shown by FIG. 4A, by driving the reset control signal SR1 to logic high level, the reset switch TR1 may be turned on to reset the photo sensor PD. Further, by driving the reset control signal SR2 and the transmission control signal ST2 to logic high level, the rest switch TR2 and the transmission switch TX2 may be turned on to reset the float diffusion node FD and the charge storage element SCE.

In an integration stage shown by FIG. 4A, the light emitting module 120 sequentially transmits M pulse light waves EL_1 to EL_M to the space SPC. Here, M is a positive integer. The M pulse light waves EL_1 to EL_M are reflected by the object OB in the space SPC to generate M pulse reflected lights RL_1 to RL_M. Here, a time delay Td exists between the pulse reflected light (e.g., RL_1) and the corresponding pulse light wave (e.g., EL_1).

More specifically, between a time point T10 and a time point T11, the light emitting module 120 transmits the first pulse light wave EL_1. At this time, the transmission control signal ST1 at logic low level cuts off the transmission switch TX1 and the reset control signal SR1 at logic high level turns on the reset switch TR1 such that the photo sensor PD is in a reset state.

Next, between the time point T11 and a time point T12, the first pulse light wave EL_1 has been transmitted. At this time, the reset control signal SR1 at logic low level cuts off the reset switch TR1 and the transmission control signal ST1 at logic high level turns on the transmission switch TX1 such that the pixel unit PXU senses a signal (hereinafter, also known as a first partial signal) of the first pulse reflected light RL_1 within this period (i.e., between the time point T11 and the time point T12). Here, the first partial signal of the first pulse reflected light RL_1 is a delayed signal of the first pulse reflected light RL_1 with respect to the first pulse light wave EL_1. Specifically, between the time point T11 and the time point T12, the photo sensor PD is integrated based on the first partial signal of the first pulse reflected light RL_1 and transmits the accumulated charges to the charge storage element SCE.

Similarly, between the time point T12 and a time point T13, the light emitting module 120 transmits the second pulse light wave EL_2. At this time, the transmission control signal ST1 at logic low level cuts off the transmission switch TX1 and the reset control signal SR1 at logic high level turns on the reset switch TR1 such that the photo sensor PD is in the reset state.

Next, between the time point T13 and a time point T14, the second pulse light wave EL_2 has been transmitted. At this time, the reset control signal SR1 at logic low level cuts off the reset switch TR1 and the transmission control signal ST1 at logic high level turns on the transmission switch TX1 such that the pixel unit PXU senses a signal (hereinafter, also known as the first partial signal) of the second pulse reflected light RL_2 within this period (i.e., between the time point T13 and the time point T14). Here, the first partial signal of the second pulse reflected light RL_2 is a delayed signal of the second pulse reflected light RL_2 with respect to the second pulse light wave EL_2. Specifically, between the time point T13 and the time point T14, the photo sensor PD is integrated based on the first partial signal of the second pulse reflected light RL_2 and transmits the accumulated charges to the charge storage element SCE.

Similarly, between a time point T16 and a time point T17, the light emitting module 120 transmits the $M^{th}$ pulse light wave EL_M. At this time, the transmission control signal ST1 at logic low level cuts off the transmission switch TX1 and the reset control signal SR1 at logic high level turns on the reset switch TR1 such that the photo sensor PD is in the reset state.

Between the time point T17 and a time point T18, the $M^{th}$ pulse light wave EL_M has been transmitted. At this time, the reset control signal SR1 at logic low level cuts off the reset switch TR1 and the transmission control signal ST1 at logic high level turns on the transmission switch TX1 such that the pixel unit PXU senses a signal (hereinafter, also known as the first partial signal) of the $M^{th}$ pulse reflected light RL_M within this period (i.e., between the time point T17 and the time point T18). Here, the first partial signal of the $M^{th}$ pulse reflected light RL_M is a delayed signal of the $M^{th}$ pulse reflected light RL_M with respect to the $M^{th}$ pulse light wave EL_M. Specifically, between the time point T17 and the time point T18, the photo sensor PD is integrated based on the first partial signal of the $M^{th}$ pulse reflected light RL_M and transmits the accumulated charges to the charge storage element SCE.

After completing M sensing operations for the $(4N+1)^{th}$ frame, by driving the transmission control signal ST2 to logic high level to turn on the transmission switch TX2, the pixel unit PXU can transmit the charges stored by the charge storage element SCE in the integration stage to the float diffusion node FD, and generate the first output voltage V11 through the source follower transistor SF. Here, the first output voltage V11 corresponds to the first partial signal of the reflected light RL. In addition, the readout circuit 144 can generate first digital information DI11 according to the first output voltage V11.

Figure 4B:
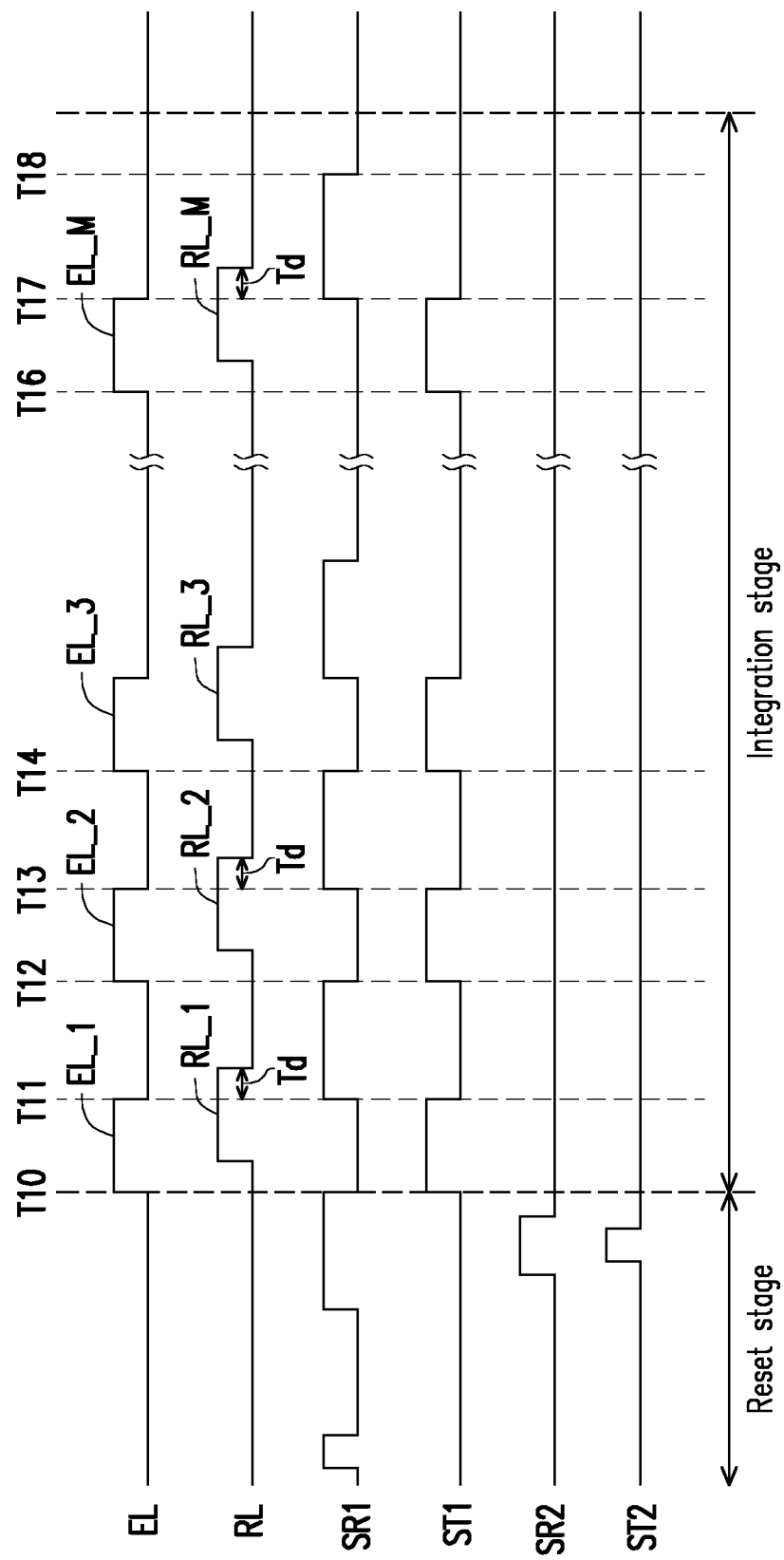

The following paragraphs refer to FIG. 1, FIG. 2, FIG. 3 and FIG. 4B together. In FIG. 4B, the pixel unit PXU performs the time-of-flight sensing operation for a $(4N+2)^{th}$ frame, wherein N is an integer greater than or equal to zero. First of all, in the reset stage shown by FIG. 4B, by driving the reset control signal SR1 to logic high level, the reset switch TR1 may be turned on to reset the photo sensor PD. Further, by driving the reset control signal SR2 and the transmission control signal ST2 to logic high level, the rest switch TR2 and the transmission switch TX2 may be turned on to reset the float diffusion node FD and the charge storage element SCE.

As similar to the integration stage shown by FIG. 4A, the light emitting module 120 sequentially transmits M pulse light waves EL_1 to EL_M to the space SPC in the integration stage shown by FIG. 4B. Here, M is a positive integer. The M pulse light waves EL_1 to EL_M are reflected by the object OB in the space SPC to generate M pulse reflected lights RL_1 to RL_M. Here, a time delay Td exists between the pulse reflected light (e.g., RL_1) and the corresponding pulse light wave (e.g., EL_1).

More specifically, between a time point T10 and a time point T11, the light emitting module 120 transmits the first pulse light wave EL_1. At this time, the reset control signal SR1 at logic low level cuts off the reset switch TR1 and the transmission control signal ST1 at logic high level turns on the transmission switch TX1 such that the pixel unit PXU senses a signal (hereinafter, also known as a second partial signal) of the first pulse reflected light RL_1 within this period (i.e., between the time point T10 and the time point T11). Specifically, between the time point T10 and the time point T11, the photo sensor PD is integrated based on the second partial signal of the first pulse reflected light RL_1 and transmits the accumulated charges to the charge storage element SCE.

Next, between the time point T11 and a time point T12, the first pulse light wave EL_1 has been transmitted. At this time, the transmission control signal ST1 at logic low level cuts off the transmission switch TX1 and the reset control signal SR1 at logic high level turns on the reset switch TR1 such that the photo sensor PD is in the reset state.

Similarly, between the time point T12 and a time point T13, the light emitting module 120 transmits the second pulse light wave EL_2. At this time, the reset control signal SR1 at logic low level cuts off the reset switch TR1 and the transmission control signal ST1 at logic high level turns on the transmission switch TX1 such that the pixel unit PXU senses a signal (hereinafter, also known as the second partial signal) of the second reflected light RL_2 within this period (i.e., between the time point T12 and the time point T13). Specifically, between the time point T12 and the time point T13, the photo sensor PD is integrated based on the second partial signal of the second pulse reflected light RL_2 and transmits the accumulated charges to the charge storage element SCE.

Next, between the time point T13 and a time point T14, the second pulse light wave EL_2 has been transmitted. At this time, the transmission control signal ST1 at logic low level cuts off the transmission switch TX1 and the reset control signal SR1 at logic high level turns on the reset switch TR1 such that the photo sensor PD is in the reset state.

Similarly, between a time point T16 and a time point T17, the light emitting module 120 transmits the $M^{th}$ pulse light wave EL_M. At this time, the reset control signal SR1 at logic low level cuts off the reset switch TR1 and the transmission control signal ST1 at logic high level turns on the transmission switch TX1 such that the pixel unit PXU senses a signal (hereinafter, also known as the second partial signal) of the $M^{th}$ reflected light RL_M within this period (i.e., between the time point T16 and the time point T17). Specifically, between the time point T16 and the time point T17, the photo sensor PD is integrated based on the second partial signal of the $M^{th}$ pulse reflected light RL_M and transmits the accumulated charges to the charge storage element SCE.

Next, between the time point T17 and a time point T18, the $M^{th}$ pulse light wave EL_M has been transmitted. At this time, the transmission control signal ST1 at logic low level cuts off the transmission switch TX1 and the reset control signal SR1 at logic high level turns on the reset switch TR1 such that the photo sensor PD is in the reset state.

After completing M sensing operations for the $(4N+2)^{th}$ frame, by driving the transmission control signal ST2 to logic high level to turn on the transmission switch TX2, the pixel unit PXU can transmit the charges stored by the charge storage element SCE in the integration stage to the float diffusion node FD, and generate the first output voltage V12 through the source follower transistor SF. Here, the first output voltage V12 corresponds to the second partial signal of the reflected light RL. In addition, the readout circuit 144 can generate first digital information DI12 according to the first output voltage V12.

Figure 4C:
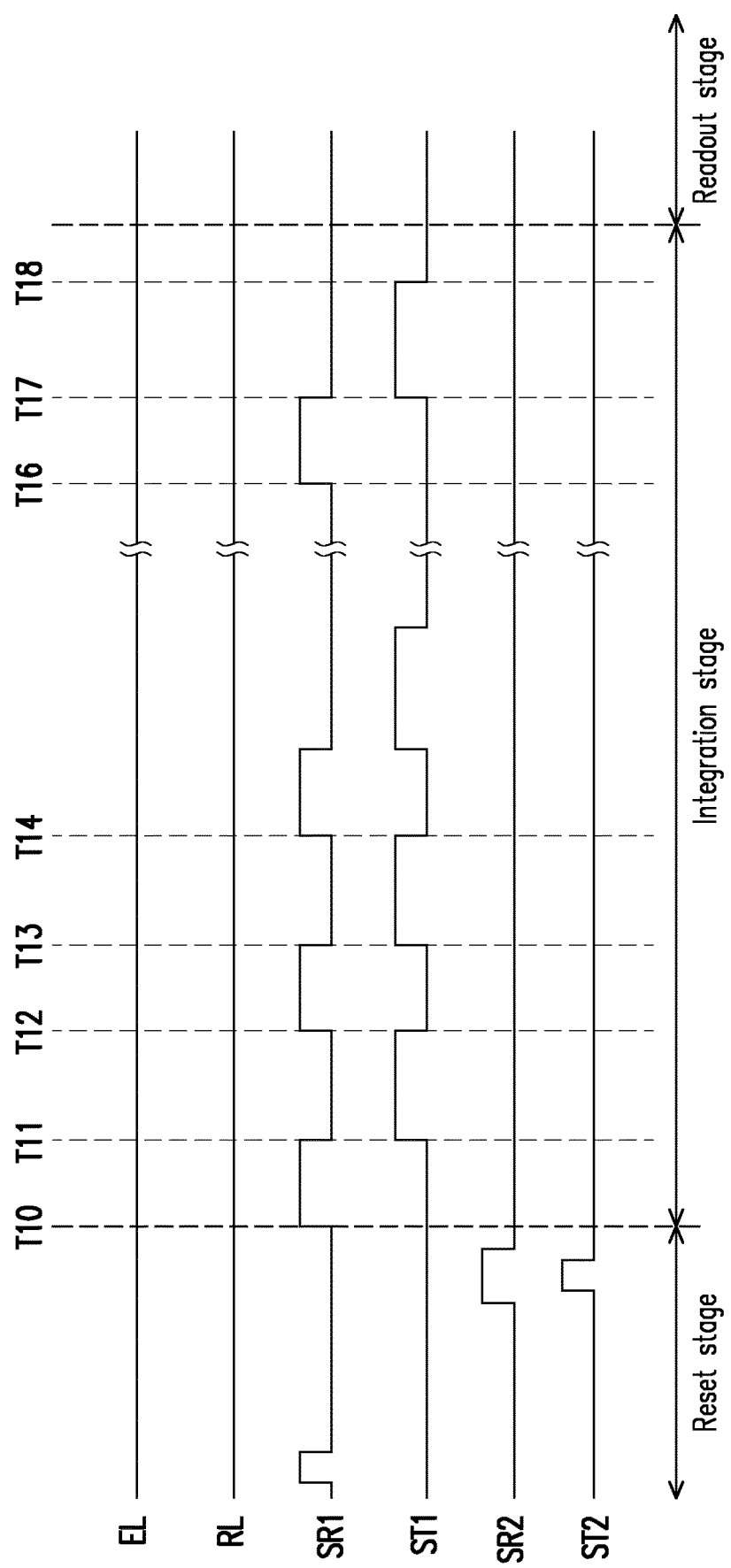

The following paragraphs refer to FIG. 1, FIG. 2, FIG. 3 and FIG. 4C together. In FIG. 4C, the pixel unit PXU performs the time-of-flight sensing operation for a $(4N+3)^{th}$ frame, wherein N is an integer greater than or equal to zero. The time-of-flight sensing operation for the $(4N+3)^{th}$ frame shown by FIG. 4C is similar to the time-of-flight sensing operation for the $(4N+1)^{th}$ frame shown by FIG. 4A, and a difference between the two is that, the light emitting module 120 does not transmit the light wave EL into the space SPC in a sensing operation for the $(4N+3)^{th}$ frame, and thus the reflected light RL is not generated. Therefore, compared to the fact that the pixel unit PXU senses the first partial signal of the reflected light RL within one period in the sensing operation for the $(4N+1)^{th}$ frame and accordingly generate the first output voltage V11, the pixel unit PXU senses a first partial signal of a background light (a.k.a. an ambient light) in the space SPC within the same period in the sensing operation for the $(4N+3)^{th}$ frame and accordingly generates the first output voltage V13 corresponding to the first partial signal of the background light. In addition, the readout circuit 144 can generate first digital information DI13 according to the first output voltage V13.

Figure 4D:
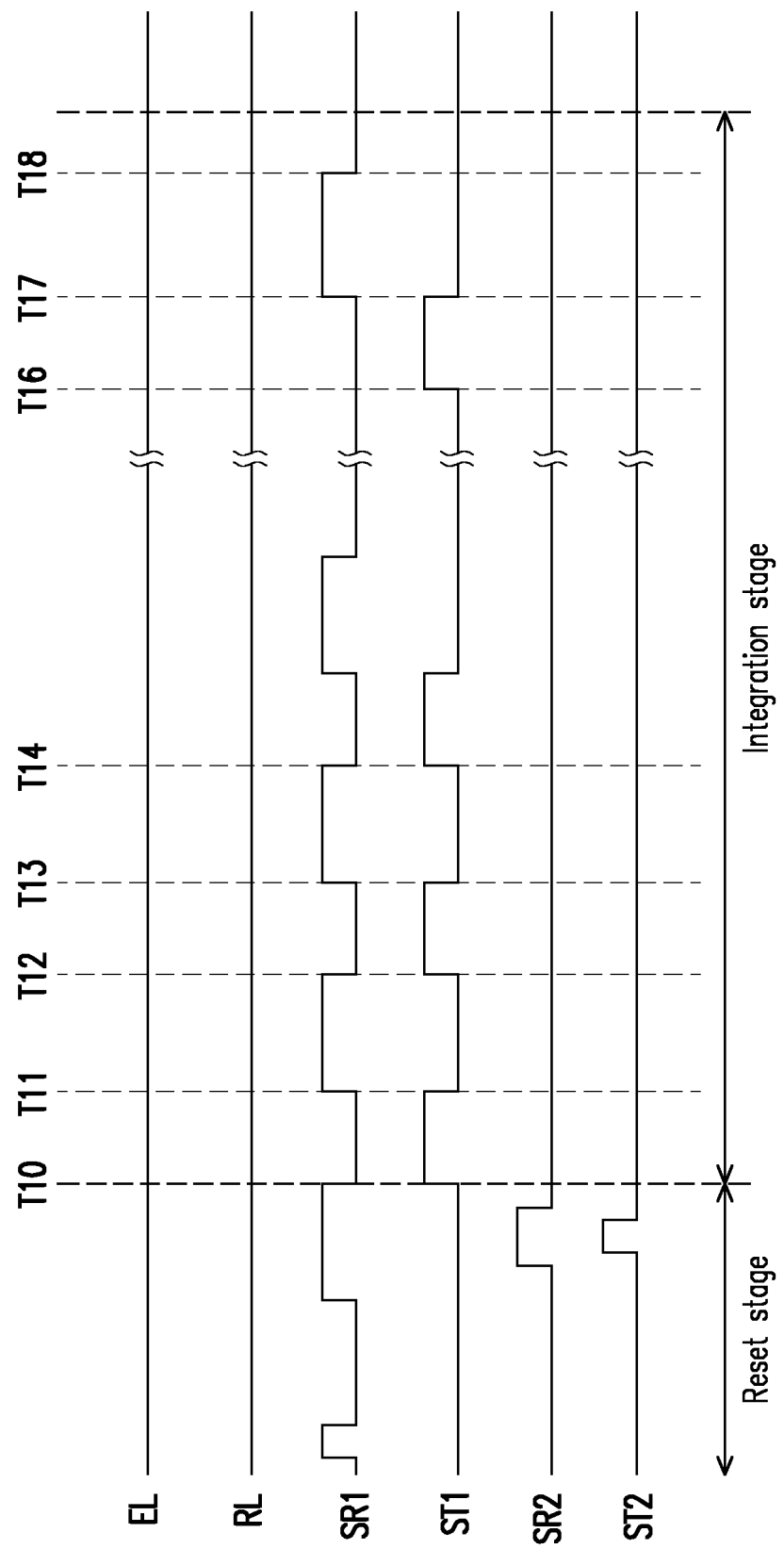

The following paragraphs refer to FIG. 1, FIG. 2, FIG. 3 and FIG. 4D together. In FIG. 4D, the pixel unit PXU performs the time-of-flight sensing operation for a $(4N+4)^{th}$ frame, wherein N is an integer greater than or equal to zero. The time-of-flight sensing operation for the $(4N+4)^{th}$ frame shown by FIG. 4D is similar to the time-of-flight sensing operation for the $(4N+2)^{th}$ frame shown by FIG. 4B, and a difference between the two is that, the light emitting module 120 does not transmit the light wave EL into the space SPC in a sensing operation for the $(4N+4)^{th}$ frame, and thus the reflected light RL is not generated. Therefore, compared to the fact that the pixel unit PXU senses the second partial signal of the reflected light RL within one period in the sensing operation for the $(4N+2)^{th}$ frame and accordingly generate the first output voltage V12, the pixel unit PXU senses a second partial signal of the background light in the space SPC within the same period in the sensing operation for the $(4N+4)^{th}$ frame and accordingly generates the first output voltage V14 corresponding to the second partial signal of the background light. In addition, the readout circuit 144 can generate first digital information DI14 according to the first output voltage V14.

After the readout circuit 144 obtains the first digital information DI11 to DI14, the processing circuit 146 can perform an operation on the first digital information DI11 to DI14 of the pixel units PXU in the first mode to obtain a digital pixel value corresponding to the pixel unit PXU. Further, since the background light exists in the space SPC, the pixel unit PXU will sense the background light in the space SPC while sensing the reflected light RL, such that the first digital information DI11 (DI12) includes information regarding the reflected light RL and information regarding the background light. Because the background light belongs to a noise, the processing circuit 146 can subtract the first digital information DI13 from the first digital information DI11, so as to obtain digital information DI1A that actually corresponds to the first partial signal of the reflected light RL. Similarly, the processing circuit 146 can subtract the first digital information DI14 from the first digital information DI12, so as to obtain digital information DI1B that actually corresponds to the second partial signal of the reflected light RL. In addition, the processing circuit 146 can calculate a digital pixel value DPV corresponding to the pixel unit PXU according to the digital information DI1A and the digital information DI1B in the first mode. Here, the digital pixel value DPV is used to represent a value of a distance between the image sensing system 100 and one of points on a surface of the object OB.

Figure 4E:
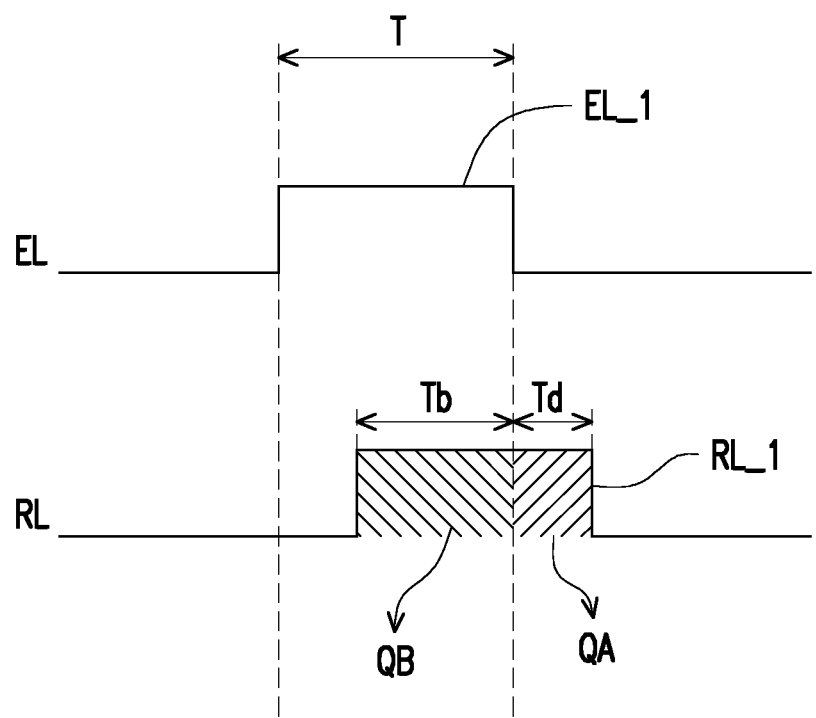
FIG. 4E illustrates a timing diagram of a pulse light wave and a pulse reflected light in the time-of-flight sensing operation performed by the pixel unit in the first mode according to an embodiment of the invention.

Specifically, with reference to FIG. 4E, FIG. 4E illustrates a timing diagram of a pulse light wave and a pulse reflected light in the time-of-flight sensing operation performed by the pixel unit in the first mode according to an embodiment of the invention. Here, both pulse widths of the pulse light wave EL_1 and the pulse reflected light RL_1 are T, and a time delay Td exists between the pulse reflected light RL_1 and the corresponding pulse light wave EL_1.

Further, an amount of charges QA accumulated by the photo sensor PD that senses the pulse reflected light RL_1 in the time delay Td corresponds to the digital information DI1A, and an amount of charges QB accumulated by the photo sensor PD that senses the pulse reflected light RL_1 in a period Tb corresponds to the digital information DI1B. The amounts of charges QA and QB and the period Tb may respectively be expressed by Equation (1) to Equation (3), wherein RLI represents a light intensity of the pulse reflected light RL_1.

$$QA = Td \times RLI \qquad \text{Equation (1)}$$

$$QB = Tb \times RLI \qquad \text{Equation (2)}$$

$$T = Tb + Td \qquad \text{Equation (3)}$$

According to Equation (1) to Equation (3), Equation (4) to Equation (6) may be obtained.

$$QA + QB = T \times RLI \qquad \text{Equation (4)}$$

$$RLI = (QA + QB) \div T \qquad \text{Equation (5)}$$

$$Td = QA \div RLI \qquad \text{Equation (6)}$$

Equation (7) may be obtained by substituting Equation (5) in Equation (6).

$$Td = QA \div RLI = T \times (QA \div (QA + QB)) \qquad \text{Equation (7)}$$

In addition, as shown by FIG. 1, the time delay Td is a round-trip time of the light wave travelling between the image sensing system 100 and one of points on the surface of the object OB. Therefore, a value DR of the distance between the image sensing system 100 and one of points on the surface of the object OB may be determined according to Equation (8), wherein C in Equation (8) represents speed of light.

$$\begin{aligned} DR &= C \times (Td \div 2) \qquad \text{Equation (8)} \\ &= C \times T \times (QA \div (QA + QB)) \div 2 \\ &= C \times T \times (DI1A \div (DI1A + DI1B)) \div 2 \end{aligned}$$

In an embodiment of the invention, for improving sensitivity of the multi-function image sensor 140 in the first mode (i.e., the time-of-flight sensing operation), the processing circuit 146 may divide the pixel array circuit 142 into a plurality of pixel groups. Here, each of the pixel groups includes at least two adjacent pixel units. The processing circuit 146 can add the digital pixel values corresponding to the pixel units in each of the pixel groups together to generate and output a combined pixel value corresponding to the pixel group. In this way, although resolution of the multi-function image sensor 140 in the first mode may be reduced (due to a combination of the pixel values), sensitivity thereof may be effectively improved.

Figure 5A:
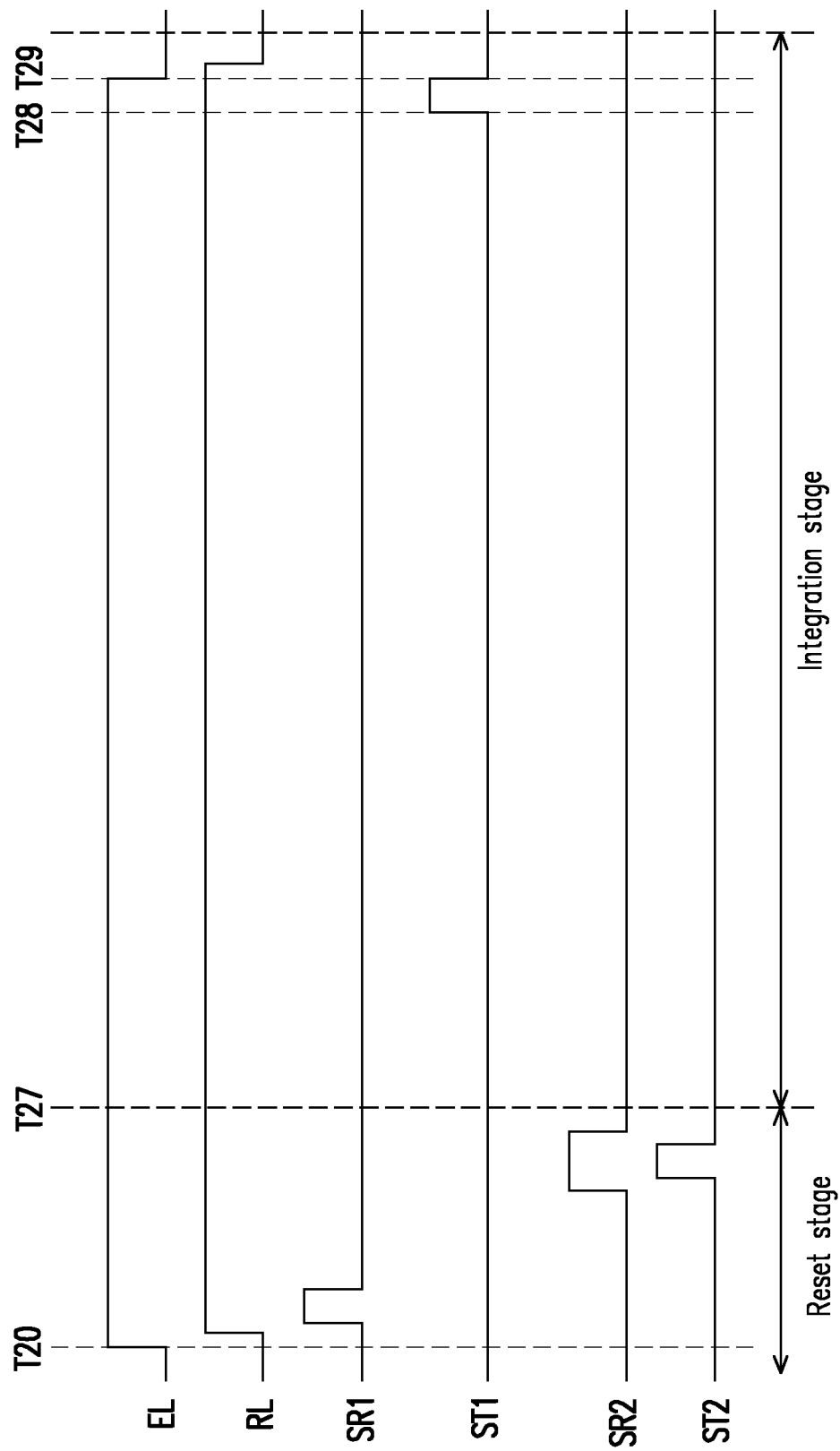
FIG. 5A and FIG. 5B illustrate timing diagrams of signals in the structured light sensing operation performed by the pixel unit in the second mode according to an embodiment of the invention.
Figure 5B:
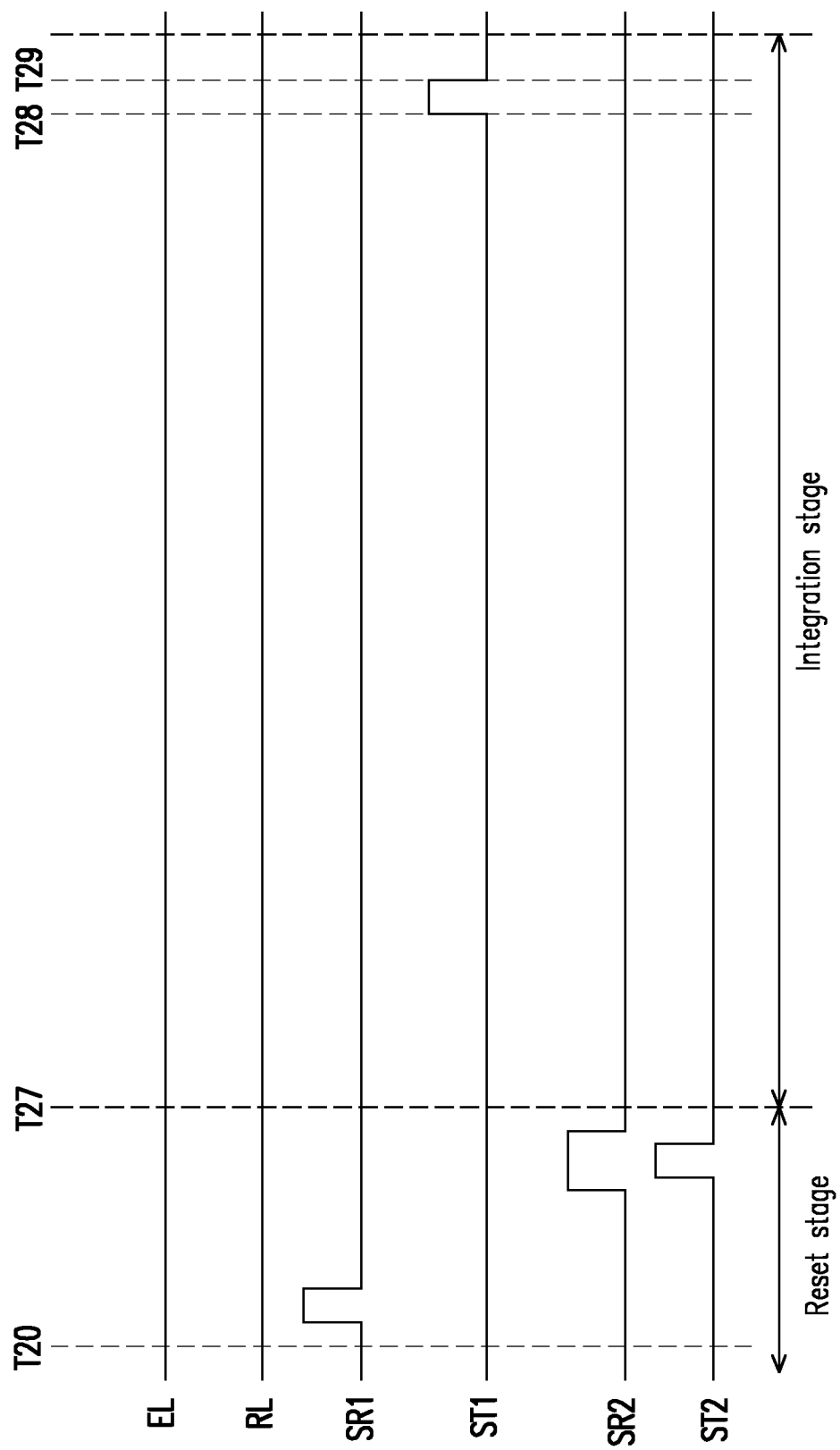

FIG. 5A and FIG. 5B illustrate timing diagrams of signals in the structured light sensing operation performed by the pixel unit in the second mode according to an embodiment of the invention. Here, the reset control signals SR1 and SR2 and the transmission control signals ST1 and ST2 illustrated in FIG. 5A to FIG. 5B are the second control signal group TS2 shown by FIG. 2. The following paragraphs refer to FIG. 1, FIG. 2, FIG. 3 and FIG. 5A together. In FIG. 5A, the pixel unit PXU performs the structured light sensing operation for a $(2N+1)^{th}$ frame, wherein N is an integer greater than or equal to zero. First of all, the light emitting module 120 starts to transmit the light wave EL into the space SPC at a time point T20, and the reflected light RL is generated after the light wave EL is reflected by the object OB in the space SPC.

In the reset stage shown by FIG. 5A, by driving the reset control signal SR1 to logic high level, the reset switch TR1 may be turned on to reset the photo sensor PD. Further, by driving the reset control signal SR2 and the transmission control signal ST2 to logic high level, the rest switch TR2 and the transmission switch TX2 may be turned on to reset the float diffusion node FD and the charge storage element SCE.

Next, the pixel unit PXU enters the integration stage at a time point T27. At this time, the reset control signals SR1 and SR2 and the transmission control signals ST1 and ST2 are all at logic low level such that the reset switches TR1 and TR2 and the transmission switches TX1 and TX2 are in a cut off state and the pixel unit PXU senses the reflected light RL. In detail, in the integration stage, the photo sensor PD is integrated based on the reflected light RL.

At a time point T28, the transmission control signal ST1 is switched to logic high level to turn on the transmission switch TX1 such that the charges accumulated by the photo sensor PD is transmitted to the charge storage element SCE. Then, at a time point T29, the light emitting module 120 stops transmitting the light wave EL, and the transmission control signal ST1 is switched to logic low level to cut off the transmission switch TX1.

After completing the sensing operation for the $(2N+1)^{th}$ frame, by driving the transmission control signal ST2 to logic high level to turn on the transmission switch TX2, the pixel unit PXU can transmit the charges stored by the charge storage element SCE in the integration stage to the float diffusion node FD, and generate the second output voltage V21 corresponding to the reflected light RL through the source follower transistor SF. In addition, the readout circuit 144 can generate second digital information DI21 according to the second output voltage V21.

The following paragraphs refer to FIG. 1, FIG. 2, FIG. 3 and FIG. 5B together. In FIG. 5B, the pixel unit PXU performs the structured light sensing operation for a $(2N+2)^{th}$ frame, wherein N is an integer greater than or equal to zero. The structured light sensing operation for the $(2N+2)^{th}$ frame shown by FIG. 5B is similar to the structured light sensing operation for the $(2N+1)^{th}$ frame shown by FIG. 5A, and a difference between the two is that, the light emitting module 120 does not transmit the light wave EL into the space SPC in a sensing operation for the $(2N+2)^{th}$ frame, and thus the reflected light RL is not generated. Therefore, compared to the fact that the pixel unit PXU senses the reflected light RL in the sensing operation for the $(2N+1)^{th}$ frame and accordingly generate the corresponding second output voltage V21, the pixel unit PXU senses the background light (a.k.a. the ambient light) in the space SPC in the sensing operation for the $(2N+2)^{th}$ frame and accordingly generate the second output voltage V22 corresponding to the background light. In addition, the readout circuit 144 can generate second digital information DI22 according to the second output voltage V22.

After the readout circuit 144 obtains the second digital information DI21 and DI22, the processing circuit 146 can perform an operation on the second digital information DI21 and DI22 of the pixel units PXU in the second mode to obtain a digital pixel value corresponding to the pixel unit PXU. Further, since the background light exists in the space SPC, the pixel unit PXU will sense the background light in the space SPC while sensing the reflected light RL, such that the second digital information DI21 includes information regarding the reflected light RL and information regarding the background light. Because the background light belongs to a noise, the processing circuit 146 can subtract the second digital information DI22 from the second digital information DI21, so as to obtain the actual digital pixel value.

In summary, in the image sensing system and the multi-function image sensor thereof as proposed in the embodiments of the invention, the pixel array circuit can perform the time-of-flight sensing operation or the structured light sensing operation according to the different control signal groups (i.e., the first control signal group and the second control signal group). Therefore, other than being applicable in the time-of-flight sensing system or the structured light sensing system, the multi-function image sensor proposed by the embodiments of the invention may also be dynamically switched between the time-of-flight sensing operation and the structured light sensing operation based on actual applications to significantly improve application range and flexibility for the image sensing system and the multi-function image sensor.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An image sensing system, comprising:
    a light emitting module, configured to transmit a light wave into a space; and
    a multi-function image sensor, configured to sense a reflected light of the light wave reflected in the space, wherein the multi-function image sensor comprises:
        a pixel array circuit, comprising a plurality of pixel units, wherein each of the pixel units is controlled by a first control signal group in a first mode to perform a time-of-flight sensing operation on the reflected light and sequentially generates a plurality of first output voltages, and each of the pixel units is controlled by a second control signal group in a second mode to perform a structured light sensing operation on the reflected light and sequentially generates a plurality of second output voltages;
        a readout circuit, coupled to the pixel array circuit, configured to respectively obtain a plurality of first digital information corresponding to the time-of-flight sensing operation according to the first output voltages generated by each of the pixel units in the first mode, and configured to respectively obtain a plurality of second digital information corresponding to the structured light sensing operation according to the second output voltages generated by each of the pixel units in the second mode; and
        a processing circuit, coupled to the readout circuit, configured to perform an operation on the plurality of first digital information of each of the pixel units in the first mode to obtain a digital pixel value corresponding to the pixel unit, wherein the plurality of first digital information respectively correspond to a $(4N+1)^{th}$ frame to a $(4N+4)^{th}$ frame,
    wherein the pixel array circuit is divided into a plurality of pixel groups, and each of the pixel groups includes at least two adjacent pixel units in the first mode, wherein the processing circuit adds the digital pixel values corresponding to the at least two adjacent pixel units in each of the pixel groups together in the first mode to generate and output a combined pixel value corresponding to the pixel group.

2. The image sensing system according to claim 1, wherein in the first mode,
    the light emitting module transmits the light wave into the space in sensing operations for the $(4N+1)^{th}$ frame and the $(4N+2)^{th}$ frame; and
    each of the pixel units senses a first partial signal of the reflected light within a first period in the sensing operation for the $(4N+1)^{th}$ frame and accordingly generates the first output voltage corresponding to the first partial signal of the reflected light, and each of the pixel units senses a second partial signal of the reflected light within a second period in the sensing operation for the $(4N+2)^{th}$ frame and accordingly generates the first output voltage corresponding to the second partial signal of the reflected light, wherein N is an integer greater than or equal to zero.

3. The image sensing system according to claim 2, wherein in the first mode, the light emitting module does not transmit the light wave into the space in sensing operations for the $(4N+3)^{th}$ frame and the $(4N+4)^{th}$ frame; and each of the pixel units senses a first partial signal of a background light in the space within the first period in the sensing operation for the $(4N+3)^{th}$ frame and accordingly generates the first output voltage corresponding to the first partial signal of the background light, and each of the pixel units senses a second partial signal of the background light within the second period in the sensing operation for the $(4N+4)^{th}$ frame and accordingly generates the first output voltage corresponding to the second partial signal of the background light.

4. The image sensing system according to claim 1, wherein in the second mode, the light emitting module transmits the light wave into the space in a sensing operation for a $(2N+1)^{th}$ frame, and each of the pixel units senses the reflected light in the sensing operation for the $(2N+1)^{th}$ frame and accordingly generates the second output voltage corresponding to the reflected light; and the light emitting module does not transmit the light wave into the space in a sensing operation for a $(2N+2)^{th}$ frame, and each of the pixel units senses a background light in the space in the sensing operation for the $(2N+2)^{th}$ frame and accordingly generates the second output voltage corresponding to the background light, wherein N is an integer greater than or equal to zero.

5. The image sensing system according to claim 4, wherein the processing circuit is configured to perform an operation on the plurality of second digital information of each of the pixel units in the second mode to obtain the digital pixel value corresponding to the pixel unit, wherein the plurality of second digital information respectively correspond to the $(2N+1)^{th}$ frame and the $(2N+2)^{th}$ frame.

6. A multi-function image sensor, configured to sense a reflected light of a light wave reflected in a space, the multi-function image sensor comprising:

a pixel array circuit, comprising a plurality of pixel units, wherein each of the pixel units is controlled by a first control signal group in a first mode to perform a time-of-flight sensing operation on the reflected light and sequentially generates a plurality of first output voltages, and each of the pixel units is controlled by a second control signal group in a second mode to perform a structured light sensing operation on the reflected light and sequentially generates a plurality of second output voltages;

a readout circuit, coupled to the pixel array circuit, configured to respectively obtain a plurality of first digital information corresponding to the time-of-flight sensing operation according to the first output voltages generated by each of the pixel units in the first mode, and configured to respectively obtain a plurality of second digital information corresponding to the structured light sensing operation according to the second output voltages generated by each of the pixel units in the second mode; and a processing circuit, coupled to the readout circuit, configured to perform an operation on the plurality of first digital information of each of the pixel units in the first mode to obtain a digital pixel value corresponding to the pixel unit, wherein the plurality of first digital information respectively correspond to the $(4N+1)^{th}$ frame to the $(4N+4)^{th}$ frame, wherein the pixel array circuit is divided into a plurality of pixel groups, and each of the pixel groups includes at least two adjacent pixel units in the first mode, wherein the processing circuit adds the digital pixel values corresponding to the at least two adjacent pixel units in each of the pixel groups together in the first mode to generate and output a combined pixel value corresponding to the pixel group.

7. The multi-function image sensor according to claim 6, wherein in the first mode, each of the pixel units senses a first partial signal of the reflected light within a first period in a sensing operation for the $(4N+1)^{th}$ frame and accordingly generates the first output voltage corresponding to the first partial signal of the reflected light, and each of the pixel units senses a second partial signal of the reflected light within a second period in a sensing operation for the $(4N+2)^{th}$ frame and accordingly generates the first output voltage corresponding to the second partial signal of the reflected light, wherein N is an integer greater than or equal to zero.

8. The multi-function image sensor according to claim 7, wherein in the first mode, each of the pixel units senses a first partial signal of a background light in the space within the first period in a sensing operation for the $(4N+3)^{th}$ frame and accordingly generates the first output voltage corresponding to the first partial signal of the background light, and each of the pixel units senses a second partial signal of the background light within the second period in a sensing operation for the $(4N+4)^{th}$ frame and accordingly generates the first output voltage corresponding to the second partial signal of the background light.

9. The multi-function image sensor according to claim 6, wherein in the second mode, each of the pixel units senses the reflected light in a sensing operation for a $(2N+1)^{th}$ frame and accordingly generates the second output voltage corresponding to the reflected light, and each of the pixel units senses a background light in the space in a sensing operation for a $(2N+2)^{th}$ frame and accordingly generates the second output voltage corresponding to the background light, wherein N is an integer greater than or equal to zero.

10. The multi-function image sensor according to claim 9, wherein:

the processing circuit is configured to perform an operation on the plurality of second digital information of each of the pixel units in the second mode to obtain the digital pixel value corresponding to the pixel unit, wherein the plurality of second digital information respectively correspond to the $(2N+1)^{th}$ frame and the $(2N+2)^{th}$ frame.

11. An image sensing system, comprising:

a light emitting module, configured to transmit a light wave into a space; and a multi-function image sensor, configured to sense a reflected light of the light wave reflected in the space, wherein the multi-function image sensor comprises:

a pixel array circuit, comprising a plurality of pixel units, wherein each of the pixel units is controlled by a first control signal group in a first mode to perform a time-of-flight sensing operation on the reflected light and sequentially generates a plurality of first output voltages, and each of the pixel units is controlled by a second control signal group in a second mode to perform a structured light sensing operation on the reflected light and sequentially generates a plurality of second output voltages; and a readout circuit, coupled to the pixel array circuit, configured to respectively obtain a plurality of first digital information corresponding to the time-of-flight sensing operation according to the first output voltages generated by each of the pixel units in the first mode, and configured to respectively obtain a plurality of second digital information corresponding to the structured light sensing operation according to the second output voltages generated by each of the pixel units in the second mode, wherein each of pixel units comprises a photo sensor, a charge storage element, a first transmission switch, a second transmission switch, a first reset switch, a second reset switch and a source follower transistor, wherein a first terminal of the first reset switch is coupled to a reset power, a second terminal of the first reset switch is coupled to a cathode of the photo sensor, an anode of the photo sensor is coupled to a ground voltage, a first terminal of the first transmission switch is coupled to the cathode of the photo sensor, a second terminal of the first transmission switch is coupled to the charge storage element, a first terminal of the second transmission switch is coupled to the charge storage element, a second terminal of the second transmission switch is coupled to a float diffusion node, a first terminal of the second reset switch is coupled to the reset power, a second terminal of the second reset switch is coupled to the float diffusion node, a first terminal of the source follower transistor is coupled to the reset power, a control terminal of the source follower transistor is coupled to the float diffusion node, wherein the first transmission switch, the second transmission switch, the first reset switch and the second reset switch are controlled by the first control signal group in the first mode and controlled by the second control signal group in a second mode.

* * * * *